United States Patent [19]

Goodman

[11] 4,268,537
[45] May 19, 1981

[54] METHOD FOR MANUFACTURING A SELF-ALIGNED CONTACT IN A GROOVED SEMICONDUCTOR SURFACE

[75] Inventor: Lawrence A. Goodman, Plainsboro, N.J.

[73] Assignee: RCA Corporation, New York, N.Y.

[21] Appl. No.: 99,598

[22] Filed: Dec. 3, 1979

[51] Int. Cl.³ .............................................. H01L 21/28
[52] U.S. Cl. ........................ 427/88; 156/643; 156/647; 156/653; 357/55; 427/91; 427/93; 427/94; 430/314; 430/318; 430/329
[58] Field of Search .............. 357/55; 427/88, 91, 427/93, 94; 156/647, 662, 653, 643; 430/314, 318, 329

[56] References Cited

U.S. PATENT DOCUMENTS

| | | | |
|---|---|---|---|
| 3,975,221 | 8/1976 | Rodgers | 357/55 |
| 3,975,925 | 8/1976 | Schwabe | 427/88 |
| 4,003,126 | 1/1977 | Holmes et al. | 357/55 |
| 4,065,783 | 12/1977 | Ouyang | 357/55 |
| 4,084,175 | 4/1978 | Ouyang | 357/55 |
| 4,102,714 | 7/1978 | DeBar et al. | 357/55 |
| 4,105,475 | 8/1978 | Jenne | 357/55 |
| 4,116,720 | 9/1978 | Vinson | 357/55 |
| 4,145,703 | 3/1979 | Blanchard | 357/55 |
| 4,156,289 | 5/1979 | Hoffman | 357/55 |
| 4,173,765 | 11/1979 | Heald et al. | 357/55 |
| 4,194,283 | 3/1980 | Hoffman | 357/55 |
| 4,206,005 | 6/1980 | Yeh et al. | 357/55 |

OTHER PUBLICATIONS

Chang et al., "Fabrication of V-MOS or U-MOS ... " IBM TDB, vol. 22, No. 7, pp. 2768-2771, Dec. 1979.

*Primary Examiner*—John D. Smith
*Attorney, Agent, or Firm*—Birgit E. Morris; Donald S. Cohen; Kenneth R. Glick

[57] ABSTRACT

An apertured mask is formed on a major surface of a semiconductor substrate, and a groove is generated in the semiconductor in an area exposed by the aperture. A layer of electrode material is then formed on the groove surface, the layer extending beyond the groove and onto the mask. The mask is then stripped, and those portions of the electrode material extending beyond the groove are removed.

13 Claims, 7 Drawing Figures

METHOD FOR MANUFACTURING A SELF-ALIGNED CONTACT IN A GROOVED SEMICONDUCTOR SURFACE

BACKGROUND OF THE INVENTION

The present invention relates to a method for forming electrical contacts on grooved semiconductor devices, and more particularly to a method for forming a contact automatically aligned within a groove.

Grooved semiconductor devices generally comprise a substantially planar semiconductor substrate having a surface which includes one or more grooves. Devices such as semiconductor field effect transistors (FETs) can incorporate grooves within which electrical contact to a source, drain or gate region is made. In a vertical metal oxide semiconductor (VMOS) FET, for example, as described in copending application Ser. No. 089,315, filed Oct. 30, 1979, a groove might intercept the device body region and the gate contact might be delineated within the groove. To optimize device performance the contact should be precisely delineated within its groove. However, the three dimensional nature of the grooved semiconductor surface can make this precise delineation difficult to achieve.

SUMMARY OF THE INVENTION

To precisely delineate a contact within a groove in a semiconductor device, an apertured mask is first generated across a semiconductor substrate and a groove is formed in the substrate through the mask aperture. The surface of the groove is then coated with electrode material such that the electrode material extends beyond the groove and onto the mask as well. The mask is then stripped, and those portions of the electrode material extending beyond the groove are etched, so as to yield the electrode defined within the groove.

DETAILED DESCRIPTION

Figure 1:
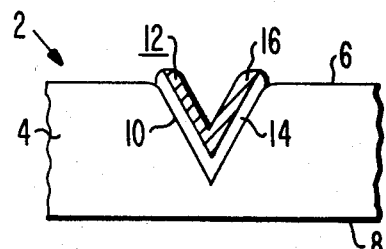
FIG. 1 is a sectional view of a device manufactured by the method of the present invention.

Referring to FIG. 1 a grooved semiconductor device 2 manufactured in accordance with the present invention is shown. The device 2 comprises a substantially planar semiconductor substrate 4 having first and second opposing major surfaces (6 and 8 respectively). A groove 10 projects into the substrate from the first surface 6 and a contact 12 is disposed on the surface of the groove. Although the illustrated groove has a V-shape, the shape is not so limited by the present invention. For example, alternatively the groove could have a curved (e.g. U-shaped) profile, a generally rectangular profile (with walls perpendicular to the major surfaces), or a substantially V-shaped profile with a flat (i.e. parallel to the major surfaces) bottom surface. In the preferred embodiment the contact 12 includes an insulating layer 14 disposed on the groove surface and an electrode 16 disposed on the insulating layer. However, if desired, the insulating layer 14 can be eliminated and the electrode 16 can be disposed directly on the groove surface.

By way of example, device 2 can be a grooved gate insulated gate field effect transistor (IGFET), including a substrate 4 of monocrystalline silicon, an insulating layer 14 of silicon oxide and a gate electrode 16 of either metal or polycrystalline silicon. When the gate contact 12 of such a device is appropriately biased, a conduction channel is induced in that portion of the substrate 4 beneath the gate. To accurately define the location of the conduction channel therefore requires an accurately delineated gate. In FIGS. 2–7, the preferred embodiment of a process to achieve this accurate delineation is shown.

Figure 2:
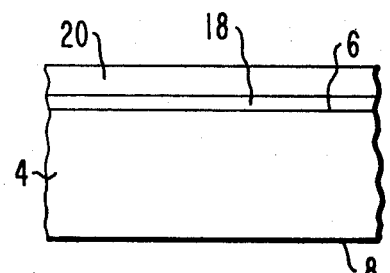
FIGS. 2–7 illustrate the process sequence for the preferred embodiment of the present invention.

Referring to FIG. 2, a substrate 4 having first and second opposing major surfaces (6 and 8 respectively) is provided. A first mask layer 18 is formed on the first surface 6 and a second mask layer 20 is formed across the first mask layer 18. In the preferred embodiment the substrate 4 is monocrystalline silicon, the first mask layer 18 is silicon oxide and the second mask layer 20 is silicon nitride. The silicon oxide layer should be approximately 500–5000 angstroms thick and can be formed, for example, by heating the substrate in an oxidizing atmosphere. The silicon nitride layer should be approximately 1000–6000 angstroms thick and can be formed, for example, by chemical vapor deposition.

Figure 3:
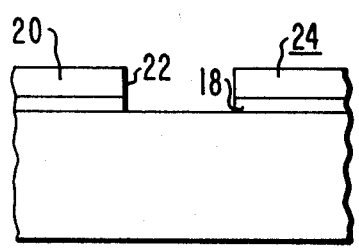

Referring to FIG. 3, an aperture 22 corresponding to the ultimate location of the groove 10 is formed in the first and second mask layers, so as to form an apertured mask 24. The aperture 22 can be formed, for example, by generating an appropriate photoresist pattern on the second mask layer 20, plasma etching the silicon nitride second mask layer 20, and etching the silicon oxide first mask layer 18 in hydrofluoric acid.

Figure 4:
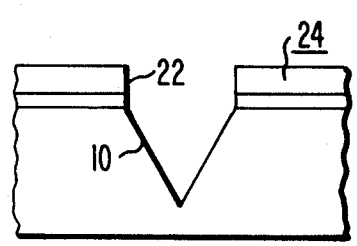

Referring to FIG. 4, the groove 10 is next formed within the aperture 22 of mask 24. When the groove is V-shaped it can be formed by anisotropic etching, for example, as described in "Fabrication of Novel Three-Dimensional Microstructures by the Anisotropic Etching of (100) and (110) Silicon", E. Bassous, IEEE Transactions, ED 25, No. 10, Oct., 1978.

Figure 5:
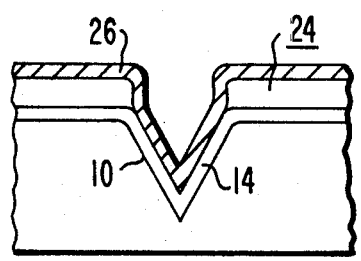

Referring to FIG. 5, the materials which will ultimately comprise the contact 12 are than formed. In the preferred embodiment an insulated gate contact is created by forming an insulating layer 14 (such as silicon oxide) on the surface of the groove 10, and a layer of electrode material 26 over the insulating layer. The insulating layer and electrode material should completely cover the groove surface and the electrode material should extend beyond the groove (i.e. onto the surrounding mask 24) as well. When the insulating layer 14 is silicon oxide it can be formed by thermal growth (if the semiconductor substrate is silicon). The electrode material 26 is electrically conductive, and can be metal or polycrystalline silicon. The electrode material 26 can be formed, for example, by thin film deposition techniques such as evaporation, sputtering or chemical vapor deposition.

Figure 6:
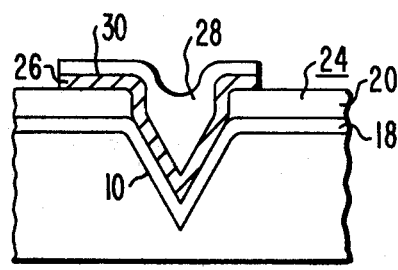

Referring to FIG. 6, the electrode material 26 is then delineated to an area substantially confined to the groove 10 but extending beyond the groove. This can be achieved utilizing a coarse (i.e. non-critical) photolithographic sequence. For example, photoresist 28 can be applied across the exposed surface 30 of the electrode material 26 and patterned such that photoresist remains in the general area of the groove. It should be noted that although a puddle of photoresist 28 might be formed in the groove during this operation, subsequent processing will not be detrimentally affected. The electrode material not covered by photoresist can then be etched so as to yield the desired structure, and the remaining photoresist can then be stripped. In this coarse photolithographic sequence the tolerance associated with aligning the photoresist 28 to the groove 10 is of a similar order of magnitude as the width of the groove. For example, if the groove width is 5-10 microns a photoresist pattern misalignment of 2-4 microns can be tolerated.

Figure 7:
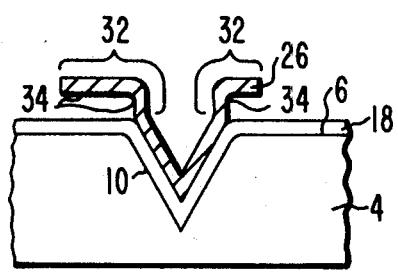

Referring to FIG. 7, the second mask layer 20 is then stripped so as to yield freestanding portions 32 of electrode material 26 extending beyond the groove 10. When the second mask layer is silicon nitride it can be stripped by plasma etching. The freestanding portions 32 are then removed, for example, by chemical etching, such that the electrode material which remains is essentially confined to the groove. In the illustrated embodiment this etching is performed so that the etchant impinges on all surfaces of the freestanding portions, and can be accomplished by immersion in an appropriate etchant. It should be recognized, however, that immersion etching will subject all exposed electrode material 26 to attack. In addition to all exposed surfaces of the freestanding portions being etched, the exposed surface of the electrode material within the groove (i.e. the electrode material top surface 30) will be etched. Since the freestanding portions 32 are essentially etched from two sides simultaneously, i.e. from those surfaces which were previously adjacent to the mask 24 (the undersides 34) as well as the top surface 30, the freestanding portions will be completely etched before all the electrode material in the groove is etched. In the time it takes to completely etch the freestanding portions 32, the electrode material in the groove will be reduced to approximately one-half its original thickness. The completed electrode 16 will therefore comprise approximately one-half of the originally formed thickness of electrode material 26.

During the etching of the freestanding portions 32 the first mask layer 18 serves to protect the semiconductor surface 6 from the etchant. This is particularly beneficial when the substrate 4 is silicon and the electrode material 26 is polycrystalline silicon. Following the etching of the freestanding portions 32 the first mask layer is stripped so as to yield the device 2 illustrated in FIG. 1. It can be stripped, for example, by the technique previously used to form the aperture 22. Alternatively, the first mask layer 18 can be stripped prior to removing the freestanding portions, for example, when the process used to remove the freestanding portions does not readily attack the substrate 4. Furthermore, it should be noted that the invention does not require that the first mask layer be stripped. For example, subsequent processing of device 2 might be facilitated by the presence of a silicon oxide mask layer 18 on the first surface 6, in which case the silicon oxide layer should be allowed to remain.

Variations of the preferred embodiment are also possible. For example, referring to FIGS. 6 and 7, the second mask layer 20 can be stripped prior to stripping the photoresist 28 which was used to delineate the electrode material 26. It this variation, after the second mask layer 20 is stripped essentially the only exposed electrode material will be the undersides 34 of the freestanding portions 32. Now when the electrode material 26 is etched the attack will substantially be limited to the undersides 34 of the freestanding portions, and no reduction from the original thickness of the electrode material will occur.

In a second embodiment, the apertured mask 24 comprises a single layer of mask material, such as thermally grown silicon oxide, rather than two mask layers. The processing can be the same as that described with reference to the preferred embodiment (i.e., the two mask layer structure) except that, referring to FIGS. 6 and 7, after the coarse photolithographic step the entire apertured mask 24 will be stripped rather than just the second mask layer 20. This embodiment provides the advantage of having to deposit, pattern generate and strip only a single mask layer.

In a third embodiment, both the first and second mask layers (18 and 20) are silicon oxide, and a relatively thin layer (for example, silicon nitride of approximately 500-2000 angstroms thickness) is interposed between the first and second mask layers. Since silicon oxide is more readily etched than silicon nitride this embodiment facilitates the second mask layer 20 stripping operation. The interposed silicon nitride layer can subsequently be stripped relatively quickly (because of its thinness) prior to stripping the first mask layer 18.

The disclosed embodiments thus describe a method for forming a contact aligned within a groove on a semiconductor device. It should be understood that various changes in form and details may be made without departing from the scope of the invention.

What is claimed is:

1. A method for fabricating a contact aligned within a groove, comprising:
   providing a semiconductor substrate having a first major surface;
   forming an apertured mask on the first surface;
   generating a groove in the first surface in an area exposed by the aperture;
   forming a layer of electrode material on the groove surface, said layer extending beyond the groove and onto the mask;
   stripping the mask; and
   removing the electrode material which extends beyond the groove.

2. A method in accordance with claim 1 further comprising delineating the electrode material to an area substantially confined to the groove prior to stripping the mask.

3. A method in accordance with claim 2 wherein the electrode material is delineated by:
   depositing a layer of photoresist across the electrode material;
   removing the photoresist from areas not in proximity to the groove; and
   removing the electrode material not covered with photoresist.

4. A method in accordance with claim 3 further comprising stripping the photoresist prior to removing the electrode material which extends beyond the groove.

5. A method in accordance with claim 3 further comprising stripping the photoresist after removing the electrode material which extends beyond the groove.

6. A method in accordance with claim 1 further comprising forming an insulating layer within the groove prior to forming the electrode material.

7. A method in accordance with claim 6 wherein the substrate is silicon and the insulating layer is silicon oxide.

8. A method in accordance with claim 1 wherein the groove is substantially V-shaped.

9. A method for fabricating a contact aligned within a groove, comprising:
   providing a semiconductor substrate having a first major surface;

forming an apertured mask, comprising a first mask layer on the first surface, and a second mask layer disposed over and coincident with the first mask layer;

generating a groove in the first surface in an area exposed by the aperture;

forming a layer of electrode material on the groove surface, said layer extending beyond the groove and onto the mask;

stripping the second mask layer;

removing the electrode material which extends beyond the groove; and stripping the first mask layer.

10. A method in accordance with claim 9 wherein the first mask layer is silicon oxide and is approximately 500–5000 angstroms thick.

11. A method in accordance with claim 9 wherein the second mask layer is silicon nitride and is approximately 1000–6000 angstroms thick.

12. A method in accordance with claim 9 further comprising a relatively thin interposed layer disposed between the first and second mask layers.

13. A method in accordance with claim 12 wherein the first and second mask layers are silicon oxide, and the relatively thin interposed layer is silicon nitride.

* * * * *